(12) United States Patent
Moosbrugger et al.

(10) Patent No.: US 8,502,735 B1
(45) Date of Patent: Aug. 6, 2013

(54) ANTENNA SYSTEM WITH INTEGRATED CIRCUIT PACKAGE INTEGRATED RADIATORS

(75) Inventors: Peter J. Moosbrugger, Erie, CO (US); Nathan A. Stutzke, Westminster, CO (US); Jennifer L. Erickson, Arvada, CO (US); Andrea K. Johnson, Boulder, CO (US)

(73) Assignee: Ball Aerospace & Technologies Corp., Boulder, CO (US)

( * ) Notice: Subject to any disclaimer, the term of this patent is extended or adjusted under 35 U.S.C. 154(b) by 389 days.

(21) Appl. No.: 12/948,401

(22) Filed: Nov. 17, 2010

Related U.S. Application Data (60) Provisional application No. 61/262,448, filed on Nov. 18, 2009.

(51) Int. Cl.
*H01Q 1/38* (2006.01)
(52) U.S. Cl.
USPC ............. 343/700 MS; 343/702; 343/853
(58) Field of Classification Search
USPC ............. 343/700 MS, 702, 853; 342/368, 342/372, 373, 375; 257/700
See application file for complete search history.

(56) References Cited

U.S. PATENT DOCUMENTS

| | | | |
|---|---|---|---|
| 5,185,613 A | 2/1993 | Whatmore et al. | |
| 5,450,090 A | 9/1995 | Gels et al. | |
| 5,528,222 A | 6/1996 | Moskowitz et al. | |
| 5,585,807 A | 12/1996 | Takei | |
| 5,598,032 A | 1/1997 | Fidalgo | |
| 5,666,272 A | 9/1997 | Moore et al. | |
| 6,031,496 A | 2/2000 | Kuittinen et al. | |
| 6,046,707 A | 4/2000 | Gaughan et al. | |
| 6,125,042 A | 9/2000 | Verdi et al. | |
| 6,201,403 B1 | 3/2001 | Rollin et al. | |
| 6,297,551 B1 | 10/2001 | Dudderar et al. | |
| 6,373,447 B1 | 4/2002 | Rostoker et al. | |
| 6,486,534 B1 * | 11/2002 | Sridharan et al. | 257/659 |
| 6,509,531 B2 | 1/2003 | Sakai et al. | |
| 6,518,885 B1 | 2/2003 | Brady et al. | |
| 6,686,649 B1 | 2/2004 | Mathews et al. | |
| 6,770,955 B1 | 8/2004 | Coccioli et al. | |

(Continued)

OTHER PUBLICATIONS

Zhang, Y.P., "Antenna-in-Package Technology for Modern Radio Systems", Integrated Systems Research Lab, School of Electrical and Electronic Engineering, Nanyang Technological University, 2006, IEEE, 4 pages.

(Continued)

*Primary Examiner* — Hoang V Nguyen
(74) *Attorney, Agent, or Firm* — Sheridan Ross P.C.

(57) ABSTRACT

An antenna system that includes one or more radiator packages on a first side of an antenna substrate and one or more support packages on a second side of the antenna substrate are provided. Embodiments of the present invention include antenna systems incorporating a plurality of radiator packages on a first side of the antenna substrate and a plurality of support packages on the second side of the antenna substrate. The radiator packages generally include a radiator element and an integrated circuit that are incorporated into a common package. The integrated circuit of the radiator package can comprise an amplifier and/or other electronic components. The support packages generally provide one or more additional electronic components. For example, a support package integrated circuit can provide a phase shifter, amplifier, and/or other electronic components. The antenna substrate generally incorporates electrical conductors for operatively interconnecting each radiator package to at least one support package.

22 Claims, 9 Drawing Sheets

U.S. PATENT DOCUMENTS

| | | | |
|---|---|---|---|
| 6,818,985 | B1 | 11/2004 | Coccioli et al. |
| 6,847,275 | B2 | 1/2005 | Sayanagi et al. |
| 6,975,029 | B2 | 12/2005 | Horie |
| 7,348,932 | B1 * | 3/2008 | Puzella et al. ............... 343/853 |
| 7,369,090 | B1 | 5/2008 | Beard |
| 7,880,677 | B2 * | 2/2011 | Rofougaran et al. .. 343/700 MS |
| 8,256,685 | B2 * | 9/2012 | Chen et al. ................... 235/492 |
| 2001/0052645 | A1 * | 12/2001 | Op'T Eynde et al. ........ 257/700 |

OTHER PUBLICATIONS

Ohata, Keiichi, "Millimeter-Wave IC Packaging Technology—State of the Art and Future Trends—", Photonic and Wireless Devices Research Laboratories, System Devices and Fundamental Research, NEC Corporation, GAAS99, Munich 1999, 4 pages.

Wi et al., "Package-Level Integrated LTCC Antenna for RF Package Application", IEEE Transactions on Advanced Packaging, vol. 30, No. 1, Feb. 2007, 10 pages.

Wang et al., "0.18-μm CMOS Push-Pull Power Amplifier With Antenna in IC Package", IEEE Microwave and Wireless Components Letters, vol. 14, No. 1, Jan. 2004, 3 pages.

Mestdagh et al., "Antenna-on-Package Concept: Shielding of Backside Radiation and Study of Electromagnetic Near Field inside Package", Wireless Technology, 2005, 4 pages.

Mestdagh et al., "Conceptual Structure for the Integration of Antennas with Packaging Technology", 34th European Microwave Conference, Amsterdam, 2004, 4 pages.

"Advanced integrated antenna PACkage for BLUEtooth wireless communication", Fifth Framework Programme, FP5 Project Record, Cordis RTD-Projects, European Communities, 2005, 4 pages.

"First Antenna-in-package Solution for Single-chip 60 GHz Radio", available at http://www.sciencedaily.com/releases/2008/10/081021120910.htm, ScienceDaily, Oct. 21, 2008, 2 pages.

* cited by examiner

ANTENNA SYSTEM WITH INTEGRATED CIRCUIT PACKAGE INTEGRATED RADIATORS

CROSS-REFERENCE TO RELATED APPLICATIONS

This application claims the benefit of U.S. Provisional Patent Application Ser. No. 61/262,448, filed Nov. 18, 2009, the entire disclosure of which is hereby incorporated herein by reference.

FIELD

The present invention is directed to an antenna system with integrated circuit packages having integrated or associated radiators.

BACKGROUND

Electronic circuits, including electronic circuits used in connection with antenna systems, typically include a number of components. These components can be discrete devices, or provided as part of integrated circuits. Whether provided as discrete devices or integrated circuits, multiple electronic components are often interconnected to one another by placing those components on one or more printed circuit boards. In addition to providing a structural member to which components can be attached, a printed circuit board typically provides electrically conductive lines or traces on one or more layers to conduct radio frequency, power and control signals to and between attached components. When used in connection with implementing complex circuits, the design of the individual circuit boards can become quite complex. In addition, where a large number of components are to be interconnected to a printed circuit board, the area of the board can become quite large, and a relatively large number of layers may be required to provide the necessary connective traces. One consideration in the design of electronic circuits is the size of those circuits. In particular, by making devices smaller, certain performance parameters can be improved, and the devices can be easier to package and transport. Also, it can be desirable to maintain electronic circuitry within size limits that are defined by certain components of a device implemented using the electronic circuitry or a component of that circuitry.

One example of electronic circuitry that can be quite complex, but that is desirably deployed within a relatively small area, is a phased array antenna. In a phased array antenna, multiple antenna elements or radiator elements are deployed across a surface. The size of each radiator element is generally determined by the intended operating frequency or frequencies of the antenna. Furthermore, as more radiator elements are provided, the antenna beam can be more narrowly focused and directed by applying selected phase delays to the signal comprising the beam that is delivered to (or received from) each of the radiator elements. That is, by varying the delay of a signal, the corresponding beam can be scanned along one dimension for a one-dimensional array of radiator elements, and along two-dimensions for a two-dimensional array of radiator elements. In addition, the maximum scanning angle that can be provided by an antenna will increase as the space between radiator elements is decreased. Accordingly, the antenna or radiator elements of a phased array antenna generally occupy an area that is defined by the size of the individual radiator elements, the number of radiator elements, and the spacing between radiator elements.

The size of the radiator elements of a phased array antenna system generally decreases as the operating frequency of the system increases. Because of the limited area defined by the radiator elements in a high frequency system, it has been difficult or impossible to provide adequate space for the support electronics. In particular, the area on the side of the antenna opposite the side on which the array of antenna elements is formed is insufficient to contain the electronic components for the supporting amplifiers and phase shifters. Therefore, in order to provide the area necessary for complex beam forming networks and associated active components for operation at high frequencies, additional circuit boards can be placed behind the board on which the radiator elements are formed. For example, additional circuit boards can be arranged such that they are perpendicular to the board on which the radiator elements are formed. This allows the space available for supporting circuitry to be expanded into three dimensions. However, the volume of such assemblies can become quite large. Moreover, in connection with antennas designed to operate at high frequencies, the small size of the corresponding radiator elements results in there being less area for corresponding support electronics. In addition, the use of multiple circuit boards can result in increased fabrication and assembly costs, as there are a large number of individual boards to which discrete components must be interconnected, and those boards must then be interconnected to one another.

SUMMARY

The present invention is directed to solving these and other problems and disadvantages of the prior art. In accordance with embodiments of the present invention, antenna systems that include one or more radiator packages having at least one integrated radiator and at least one integrated circuit are provided. The radiator packages are interconnected to a first side of an antenna substrate. One or more support packages, which can include support integrated circuits, are interconnected to a second side of the antenna substrate. Accordingly, it is possible to provide an array antenna in which the radiators and all or a relatively large proportion of the associated support electronics are provided on a single circuit board or substrate.

A radiator package in accordance with embodiments of the present invention generally includes a radiator element and an integrated circuit. The radiator element is physically and electrically interconnected to the radiator package integrated circuit. In accordance with embodiments of the present invention, a radiator package integrated circuit may provide an amplifier. As further examples, a radiator package integrated circuit may comprise a diode limiter, a low noise amplifier, one or more phase shifters, or other radio frequency devices. In addition, a radiator package may include one or more feeds connecting the radiator element to the radiator package integrated circuit. In accordance with further embodiments of the present invention, a radiator package may include a plurality of integrated circuits. In accordance with still other embodiments of the present invention, a radiator package may include a plurality of radiator elements and one or more radiator package integrated circuits.

The antenna substrate may provide interconnections between the one or more radiator packages on a first side of the antenna substrate and the one or more support packages on a second side of the antenna substrate. These interconnections can include beam forming networks. In accordance with still other embodiments of the present invention, the antenna substrate may include hybrid circuits.

A support package in accordance with embodiments of the present invention generally includes an integrated circuit. The support package integrated circuit may, for example, include one or more phase shifters. Alternatively or in addition, the support package integrated circuit may include one or more amplifiers. As further examples, the support package integrated circuit may comprise one or more phase shifters, attenuators, limiter diodes, or other radio frequency devices. Moreover, a support package can include more than one support package integrated circuit.

Additional features and advantages of embodiments of the present invention will become more readily apparent from the following description, particularly when taken together with the accompanying drawings.

DETAILED DESCRIPTION

Figure 1:
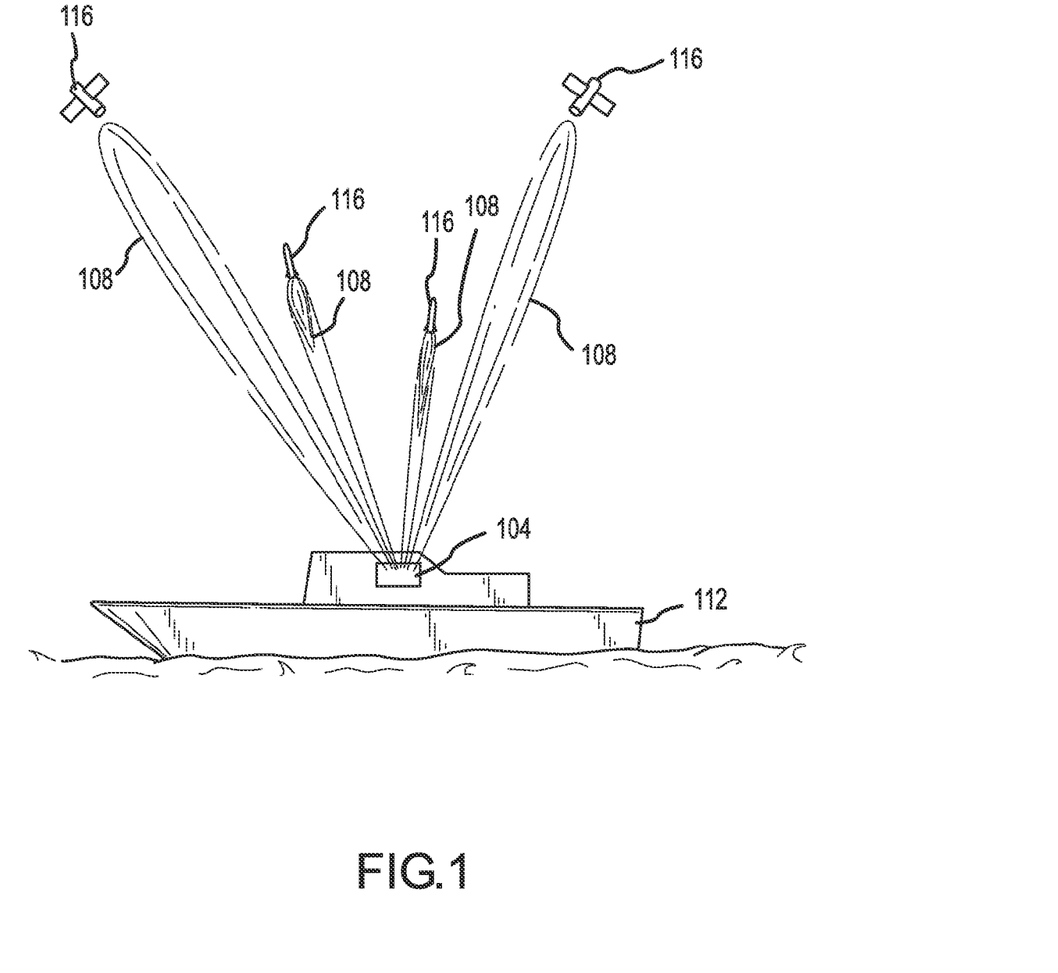
FIG. 1 depicts a multiple beam phased array antenna in accordance with embodiments of the present invention, in an exemplary operating environment.

FIG. 1 illustrates an antenna system 104 in accordance with embodiments of the present invention, in an exemplary operating environment. More particularly, the antenna system 104 illustrated in FIG. 1 comprises a phased array antenna system that is capable of forming a number of independent beams 108. In the example of FIG. 1, the beams 108 formed by the phased array antenna system 104 are steerable and are used in connection with communications between a platform 112 with which the phased array antenna system 104 is associated and various targets 116. Although depicted as being deployed on a platform 112 comprising a ship, it can be appreciated that a phased array antenna system 104 in accordance with embodiments of the present invention can be deployed in connection with any device or location where multiple signal paths or channels and/or one or more steerable beams are desired. Furthermore, while the example targets 116 depicted in the figure are shown as space borne satellites or airborne missiles, a target 116 can comprise any ground, sea, air, or space based device or platform. Also, while the system depicted in FIG. 1 has been described as being used for communications, such as for sending or receiving data, telemetry, or control instructions, it can be appreciated that another exemplary use for a phased array antenna system 104 may include radar systems for identifying and tracking targets. Furthermore, although four antenna beams 108 are depicted, a phased array antenna system 104 in accordance with embodiments of the present invention is not limited to any particular number of beams 108.

Figure 2A:
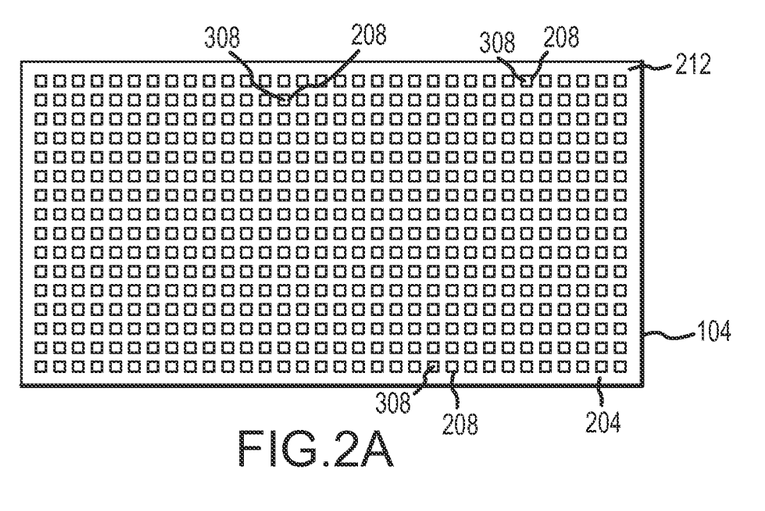
FIG. 2A depicts a first side of an antenna system in accordance with embodiments of the present invention.

With reference now to FIG. 2A, a first side of an antenna system 104 in accordance with embodiments of the present invention is depicted. As illustrated, a plurality of radiator packages 208 comprising one or more antenna elements or radiator elements 308 are deployed along and interconnected to the surface of an antenna substrate 212 on a first side 204 of the antenna substrate 212. As can be appreciated by one of skill in the art, the dimensions of the individual radiator elements 308 may be determined with reference to the operating parameters and/or desired performance of the antenna system 104. Likewise, the number and spacing of the radiator elements 308 can be determined with reference to such parameters. These parameters can include the frequency or frequencies at which the antenna system 104 operates, the maximum steering angles of the beam or beams produced by the antenna system 104, the beam patterns in the far field, and the area available on an associated platform 112 for the antenna system 104.

Figure 2B:
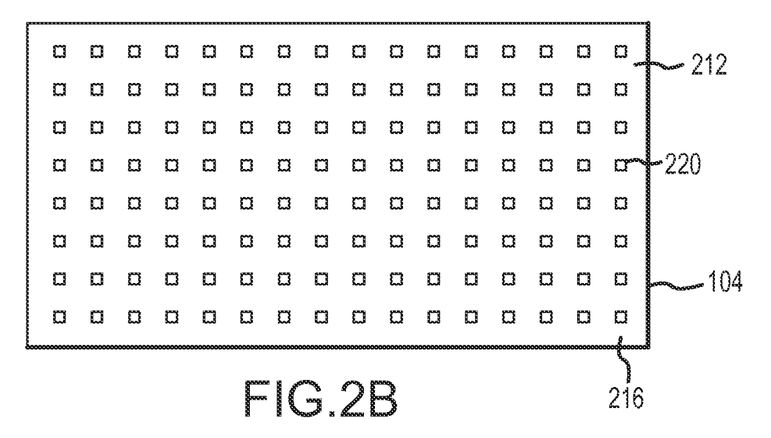
FIG. 2B depicts a second side of an antenna system in accordance with embodiments of the present invention.

FIG. 2B illustrates a second side of an antenna system 104 in accordance with embodiments of the present invention. As shown, the second side of the antenna system 104 features a plurality of support packages 220 that are interconnected to the second side 216 of the antenna substrate 212. The support packages 220 can provide electronic components that are necessary or desirable in connection with the operation of the antenna system 104, such as phase shifters and buffer amplifiers, that are not otherwise incorporated into the radiator packages 208. The components provided by the support packages 220 can but are not required to be in the form of one or more integrated circuits.

Figure 2C:
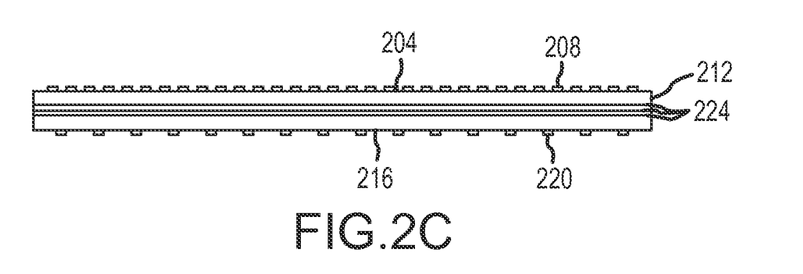
FIG. 2C depicts an antenna system in accordance with embodiments of the present invention in elevation.

FIG. 2C illustrates the exemplary antenna system 104 of FIGS. 2A and 2B in elevation. In general, the radiator packages 208 are interconnected to the first side 204 of the antenna substrate 212, while the support packages 220 are interconnected to the second side 216 of the antenna substrate 212. As depicted in FIG. 2C, the antenna substrate 212 may comprise a plurality of layers 224. More particularly, the antenna substrate 212 may provide a multilayer structure for supporting electrical interconnections between each radiator package 208 and at least one support package 220. For example, the antenna substrate 212 can comprise a multilayer printed circuit board. In addition, the layers 224 of the antenna substrate 212 may support electrical traces or other conductors that comprise hybrid matching circuits, beam forming networks, or other electrical structures. Therefore, the antenna substrate 212 provides for electrical connectivity, in addition to physically supporting the radiator packages 208 and the support packages 220.

Figure 3A:
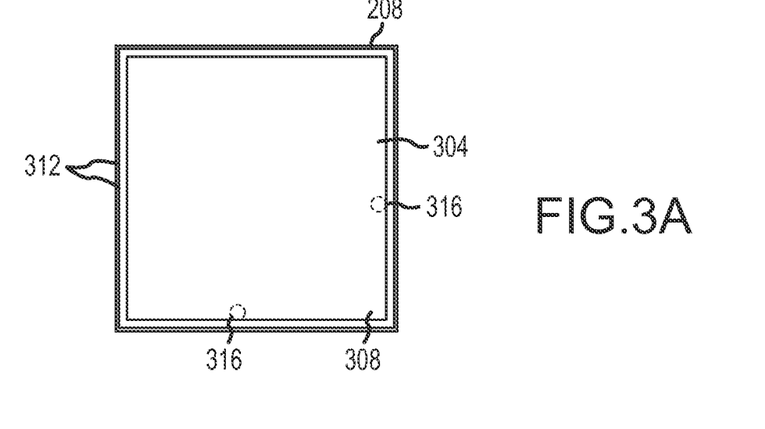
FIG. 3A depicts a first side of a radiator package in accordance with embodiments of the present invention in plan view.

FIG. 3A illustrates a first side 304 of a radiator package 208 in accordance with embodiments of the present invention. As depicted in this exemplary embodiment, the majority of the first surface 304 of the radiator package 208 comprises a radiator element 308. Also shown in FIG. 3A are the portions of radiator package substrate or structural layers 312 that extend beyond the radiator element 308, and radiator element feeds 316.

Figure 3B:
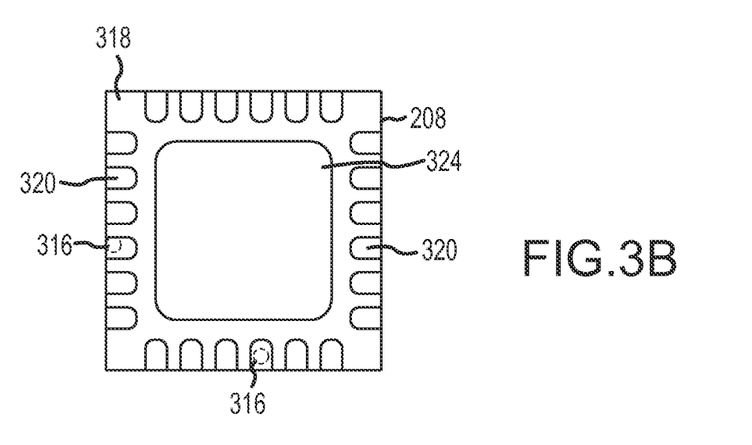
FIG. 3B depicts a second side of a radiator package in accordance with embodiments of the present invention in plan view.

FIG. 3B illustrates a second side 318 of the radiator package 208 shown in FIG. 3A. The second side 318 of the radiator package 208 in this exemplary embodiment features a plurality of pins or contacts 320, to support electrical interconnections between the radiator package 208 and the antenna substrate 212 in the assembled antenna system 104 (see FIGS. 2A-2C). This exemplary embodiment also includes a radiator package ground plane or shield 324 on the second side 318 of the radiator package 208.

Figure 3C:
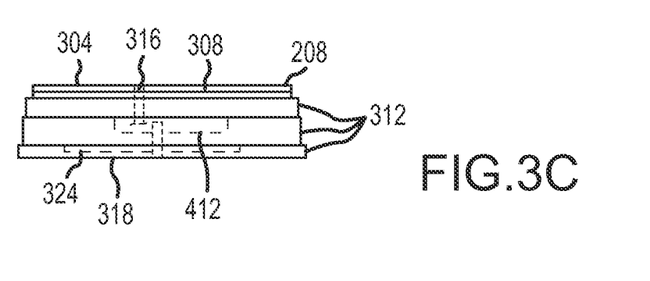
FIG. 3C depicts a radiator package in accordance with embodiments of the present invention in elevation.

FIG. 3C illustrates the exemplary radiator package 208 shown in FIGS. 3A and 3B in elevation. As can be seen from this figure, the radiator element 308 lies on top of a number of radiator package substrate layers 312. Moreover, as can be appreciated by one of skill in the art after consideration of the present disclosure, the layers 312 provide a structure and/or volume for the inclusion of one or more integrated circuit elements that support the transmit and/or receive functions of the radiator package 208. For example, an integrated circuit 412, shown by a dotted line in FIG. 3C, can be contained within the radiator package 208. As shown, the radiator element feeds 316 may extend from the radiator element 308 to the integrated circuit 412. The integrated circuit 412 can comprise one or more active components, such as amplifiers, low noise amplifiers, and/or limiter diodes, in any number or combination, that are operatively connected to the radiator element 308.

Figure 4:
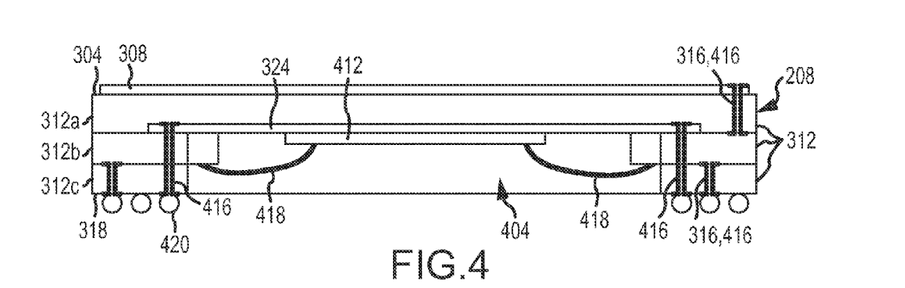
FIG. 4 is a cross-section of an exemplary radiator package in accordance with embodiments of the present invention.

FIG. 4 is a cross-section of an exemplary radiator package 208 in accordance with further embodiments of the present invention. As shown, the radiator element 308 may comprise a planar element that is supported by an upper substrate layer 312a on a first side 304 of the radiator package 208. The figure also shows a second or middle antenna substrate layer 312b. Another radiator package substrate layer 312c is shown on a second side 318 of the radiator package 208. In this exemplary embodiment, the second 312b and third 312c radiator package substrate layers are in the form of a frame such that they define a cavity 404 that is open on the second side 318 of the radiator package 208. The extent of the cavity 404 towards the first side 304 of the radiator package 208 is bounded by a ground plane or shield 324 mounted to a side of the first radiator package substrate layer 312a, opposite the side of the first radiator package substrate layer 312a to which the radiator element is mounted. An integrated circuit chip or radiator package integrated circuit 412 is interconnected to the ground shield 324 such that the radiator package integrated circuit 412 is located within the cavity 404. Wire bonds 418 electrically interconnect the integrated circuit 412 to the radiator element 308 and other components, either directly or through traces on one or more radiator package substrate layers 312, radiator element feeds 316, and/or vias 416. As a further example, flip chip interconnects could be used to interconnect devices to traces. As examples and without limitation, the radiator package integrated circuit 412 may comprise a preamplifier, low noise amplifier, power amplifier, limiter diode, or other electronic circuitry that supports the operation of the radiator element 308.

Vias 416 may extend through one or more of the radiator package substrate layers 312, to provide electrical interconnections with components of the radiator package 208. Such interconnections may be between two or more components of the radiator package 208, and/or between a component of the radiator package 208 and other components of the antenna system 104. For instance, at least some of the vias 416 may be terminated at a contact 420 that is provided for electrically interconnecting the radiator package 208 to traces on the antenna substrate 212. In accordance with an exemplary embodiment of the present invention, the electrical contacts 420 may comprise solder balls or bump bonds. At least one of the vias 416 in this exemplary embodiment comprises a radiator element feed 316 that interconnects the radiator package integrated circuit 412 to the radiator element 308. As can be appreciated by one of skill in the art, signals may be passed between the radiator element 308 and other circuitry associated with the radiator package 208 through a direct connection to a conductor or through electromagnetic coupling.

Figure 5:
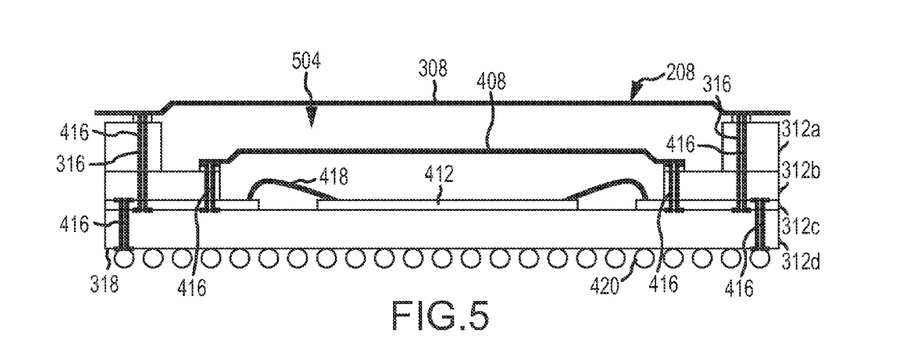
FIG. 5 is a cross-section of another exemplary radiator package in accordance with embodiments of the present invention.

FIG. 5 illustrates a radiator package 208 in accordance with other embodiments of the present invention. In this exemplary embodiment, the first radiator package substrate layer 312a comprises a support for the radiator element 308, but does not extend across the entire area of the radiator element 308. Instead, the first radiator package substrate layer 312a features an open interior area, defining a cavity 504. A second radiator package substrate layer 312b also features an open interior area, but the perimeter of the second radiator package extends further towards the interior, producing a stepped structure that supports a ground shield 408. A third radiator package substrate layer 312c features an open interior area that is smaller than the open interior area of the second radiator package substrate layer 312b, forming a further step. This further step can include electrical contacts to facilitate wire bonds 418 between traces formed as part of or on the third radiator package substrate layer 312c and a radiator package integrated circuit 412. Underlying the third radiator package substrate layer 312c and the radiator package integrated circuit 412 is a fourth radiator package substrate layer 312d. Contacts 420, which may be part of a ball grid array comprising solder balls or bump bonds, or a quad flat or quad flat no lead package, can be provided on the surface of the fourth radiator package substrate layer 312d, for electrically interconnecting the radiator package 208 to cooperating contacts on the first surface 216 of the antenna substrate 212.

At least two vias 416 may extend through one or more of the radiator package substrate layers 312 to interconnect various components. At least one of the vias 416 in this exemplary embodiment comprise radiator element feeds 316. These radiator element feeds 316 may form at least a portion of an interconnection between the radiator element 308 and the radiator package integrated circuit 412. As shown in this example, in addition to the vias 416, the feeds 316 may include traces formed on a radiator package substrate layer 312 (e.g., layer 312c) and a wire bond 418.

Figure 6:
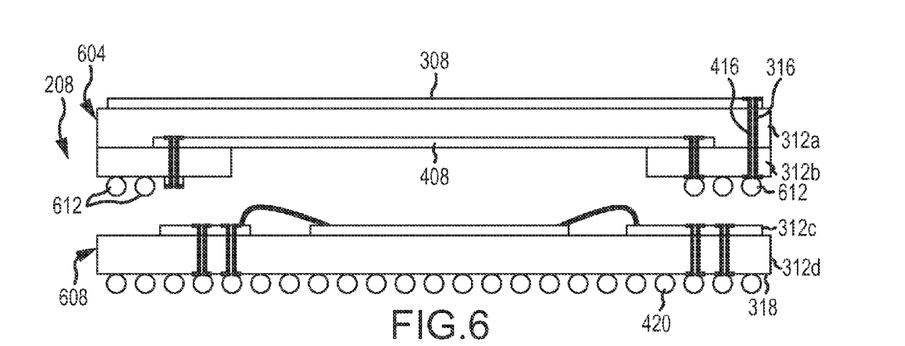
FIG. 6 is a cross-section and exploded view of another exemplary radiator package in accordance with embodiments of the present invention.

FIG. 6 illustrates yet another embodiment of a radiator package 208 in accordance with embodiments of the present invention. In this embodiment, the radiator element 308 and ground shield 408 are interconnected to a first radiator package substrate layer 312a. A second radiator package substrate layer 312b, with an open interior area, is interconnected to the side of the first radiator package substrate layer 312a to which the ground shield 408 is also interconnected, forming a shield and radiator package 604. This embodiment also includes an integrated circuit package 608 that comprises a third radiator package substrate layer 312c with an open interior area. The third radiator package substrate layer 312c is interconnected to a fourth radiator package substrate layer 312d that generally defines the second side 318 of the radiator package 208. In order to complete the radiator package 208, the shield and radiator package 604 portion is joined to the integrated circuit package 608 portion via intermediate contacts 612. In accordance with embodiments of the present invention, the intermediate contacts 612 may comprise solder balls provided as part of a ball grid array (BGA) or surface mount technology (SMT) pads.

Figure 7:
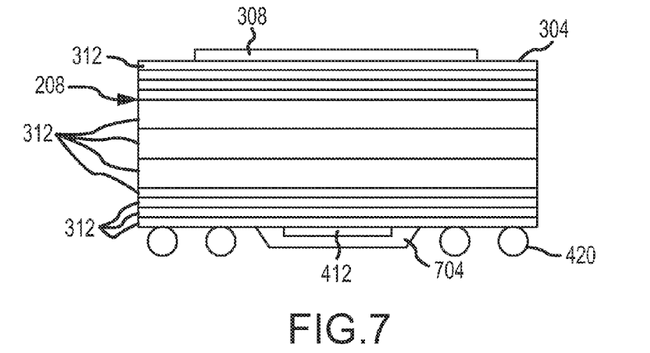
FIG. 7 is a cross-section of another exemplary radiator package in accordance with embodiments of the present invention.

FIG. 7 illustrates a radiator package 208 in accordance with other embodiments of the present invention. In this embodiment, the radiator package substrate layers 312 are continuous or substantially continuous, such that the layers 312 do not define a cavity or cavities. The radiator element 308 is interconnected to the stack of radiator package substrate layers 312 on the first side 304 of the radiator package 208, while a radiator package integrated circuit 412 is interconnected to the stack of radiator package substrate layers 312 on a second side 318 of the radiator package 208. As illustrated, the radiator package integrated circuit 412 may be contained or potted in an epoxy or other structural material 704. Contacts 420 are provided on the second side 318 of the radiator package 208 for electrically interconnecting the radiator package 208 to the first side 216 of the antenna substrate 212. In addition, vias can extend between layers 312, and the layers 312 can include traces for electrically interconnecting various components or features of the radiator package 208.

Figure 8:
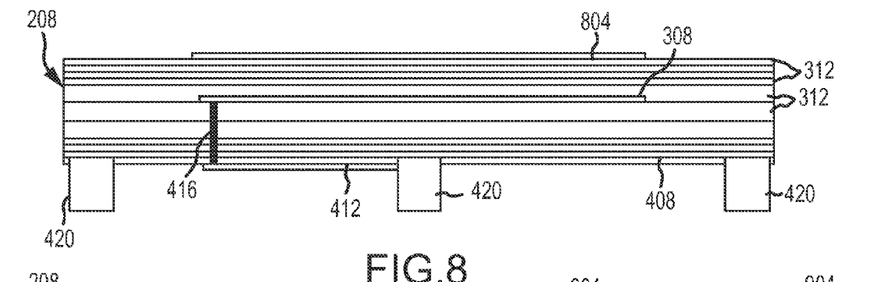
FIG. 8 is a cross-section of another exemplary radiator package in accordance with embodiments of the present invention.

FIG. 8 is a cross-section of a radiator package 208 in accordance with embodiments of the present invention in which a passive radiator 804 is provided. In this embodiment, the radiator element 308 comprising a driven radiator element is electrically interconnected to the radiator package integrated circuit 412 by one or more vias 416, while the passive radiator element 804 is not directly electrically interconnected to other components of the radiator package 208. In addition, the driven radiator element 308 is covered by one or more radiator package substrate layers 312 that support the passive radiator element 804, and that space the passive radiator element 804 apart from the driven radiator element 308. A ground shield 408 may be located between the driven radiator element 308 and the integrated circuit 412.

Figure 9:
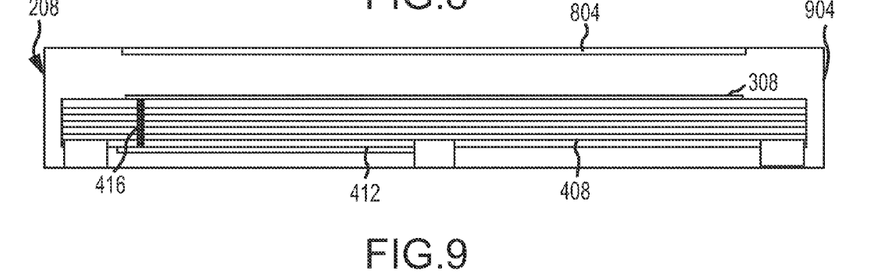
FIG. 9 is a cross-section of another exemplary radiator package in accordance with embodiments of the present invention.

FIG. 9 illustrates an embodiment of a radiator package 208 in accordance with further embodiments of the present invention. In this embodiment, a passive radiator 804 is provided that is spaced apart from the driven radiator element 308 by a hollow structure or spacer 904. The driven radiator element 308 is located on a surface of a radiator package substrate layer 312, and is interconnected to a radiator package integrated circuit 412 by a via 416. A ground shield 408 may be located between the driven radiator element 308 and the integrated circuit 412.

Figure 10:
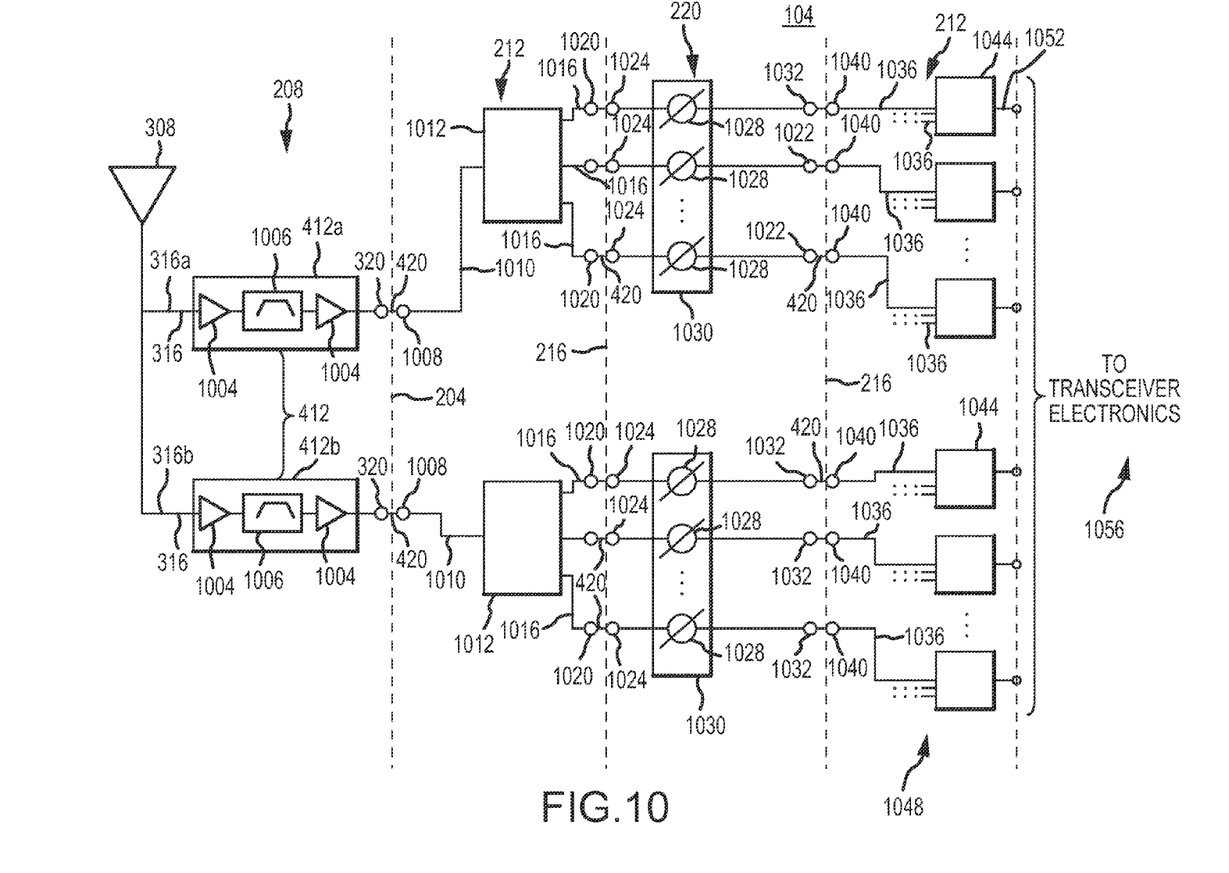
FIG. 10 is a schematic depiction of circuit elements in accordance with embodiments of the present invention.

With reference now to FIG. 10, components of at least a portion of an antenna system 104 in accordance with embodiments of the present invention are depicted in schematic form. More particularly, an antenna system 104 that includes a radiator package 208 with separate horizontally polarized and vertically polarized feeds 316 for the included antenna elements 308 is depicted. In general, a radiator package 208 in such embodiments includes a horizontally polarized radiator element feed 316a and a vertically polarized radiator element feed 316b. In addition, the radiator package 208 includes a radiator package integrated circuit 412 that comprises one or more integrated circuit elements. These integrated circuit elements can include active elements, such as one or more low noise amplifiers and/or pre-amplifiers 1004 associated with each feed 316. As a further example, the integrated circuit elements of a radiator package 208 can include one or more filters 1006 associated with each radiator element feed 316. These can be provided as part of or integral to the radiator package integrated circuit 412, or as part of circuitry or components formed elsewhere in the radiator package 208 and/or the antenna substrate 212. In addition, the radiator package 208 can include multiple radiator package integrated circuits 412. For instance, in the illustrated example, the integrated circuit 412a for the horizontally polarized signal line and the integrated circuit 412b for the vertically polarized signal line can be separate packages. Alternatively, the integrated circuits 412a and 412b can be part of a common, shared integrated circuit 412 package. As further examples, the integrated circuit or circuits 412 may comprise power amplifiers, phase shifters, limiters, or other radio frequency devices. The radiator package 208 additionally provides contacts or pins 320 for interconnecting the radiator package 208 to other components.

In accordance with embodiments of the present invention, each radiator package 208 is interconnected to an antenna substrate 212. For example, the antenna substrate 212 can include radiator package contact points 1008 that mate with corresponding contact points 320 provided by the radiator packages 208 mounted to the antenna substrate 212 via bump bonds or other electrical conductors 420. In general, the radiator package contact points 1008 are associated with the first side 204 of the antenna substrate 212. In addition, the antenna substrate 212 provides electrical conductors 1010 for interconnecting each radiator package 208 to other components of the antenna system 104. Moreover, these electrical conductors 1010 can comprise other structures, such as beam forming networks. More particularly, a conductor 1010 that is interconnected to a radiator element feed 316 can include or be interconnected to a splitter/combiner 1012 that operates to interconnect an associated radiator element feed 316 to a plurality of beam signal lines 1016. Accordingly, the antenna system 104 can support multiple independently steered beams 108. The beam signal lines 1016 may each be associated with a support package contact point 1020. Each support package contact point 1020 may be formed on the second side 216 of the antenna substrate 212.

Interconnected to the support package contact points 1020 on the second side 216 of the antenna substrate 212 are contact points 1024 provided by or as part of the support packages 220. More particularly, support package contact points 1020 can be connected to the contact points 1024 provided by the support packages 220 by bump bonds or other electrical conductors 420. In general, the support packages 220 comprise circuit elements that support operation of the antenna system 104. In addition, each support package 220 may be electrically interconnected to one or more radiator packages 208 by signal lines (e.g., conductors 1010 and beam signal lines 1016 formed on or as part of the antenna substrate 212 layers). In accordance with alternate embodiments of the present invention, each radiator package 208 may be associated with a plurality of support packages 220. In the exemplary embodiment of FIG. 10, each beam signal line 1016 associated with at least the horizontal polarization radiator feed 316a or the vertical polarization radiator feed 316b for the antenna element 308 in this example is interconnected to a phase shifter 1028 included in an integrated circuit 1030 provided by the support package 220. Moreover, each support package 220 may incorporate one or more components, such as but not limited to phase shifters, filters, combiners, matching networks, and amplifiers, that are included in one or more integrated circuits 1030 and/or that are provided as discrete components. A plurality of contact points 1032 may be provided by the support packages 220 for operatively interconnecting the phase shifters 1028 or other components to signal lines 1036 on the antenna substrate 212, via bump bonds or other connections 420 that establish an electrical connection with matching support package contact points 1040 on the antenna substrate 212. These signal lines 1036 may comprise or interconnect to splitters/combiners 1044 provided as part of beam forming networks 1048 associated with each of the beams. In particular, each of the splitters/combiners 1044 may be interconnected to a plurality of the radiator elements 308 of the antenna system 104. That plurality of radiator elements 308 can include all of the antenna system 104 radiator elements 308, or a subset of the radiator elements 308 of the antenna system 104. The splitters/combiners 1044 additionally provide signal lines 1052 for each beam that can be connected to a transceiver or other equipment 1056 for transmitting and/or receiving signals using the antenna system 104.

As can be appreciated by one of skill in the art, the antenna substrate 212 may additionally include conductors or electrically conductive traces for operatively providing power and control signals to the radiator packages 208 and the support packages 220 that are interconnected to the antenna substrate 212. In addition, although a single antenna element 308 and a single radiator package 208 are illustrated in FIG. 10, it should be appreciated that, in an antenna system 104 comprising a phased array antenna, multiple radiator elements 308 and multiple radiator packages 208 will be included. Therefore, a splitter/combiner 1044 generally provides a plurality of branch signal lines 1036 that extend to other radiator elements 308 through support packages 220 and radiator packages 208 associated with those other radiator elements 308. More particularly, the number of branch signal lines 1036 for an individual beam supported by the antenna system 104 is typically equal to the number of radiator elements 308 associated with that beam, multiplied by the number of polarizations supported by the antenna system. In addition, although the exemplary system illustrated in FIG. 10 includes three beams and two polarizations, embodiments of the present invention are not limited to any particular number of beams or polarizations.

Embodiments of the present invention provide for an antenna system 104 that includes components mounted to a single antenna substrate 212. In accordance with embodiments of the disclosed invention, the antenna substrate 212 may comprise a plurality of layers. For example, the antenna substrate 212 may comprise a multilayer printed circuit board. As can be appreciated by one of skill in the art, the use of a multiple layer circuit board allows for a large number of conductors or traces, enabling complex networks to be formed on or as part of the substrate. In accordance with further embodiments of the disclosed invention, the antenna substrate 212 may comprise a planar antenna substrate 212. In accordance with alternative embodiments of the present invention, the antenna substrate may be faceted or curved, for example to provide an antenna system 104 that conforms to the exterior surface of a platform 112 with which the antenna system 104 is associated. Accordingly, embodiments of the present invention are capable of providing antenna systems 104 that are compact and relatively inexpensive to produce.

Figure 11:
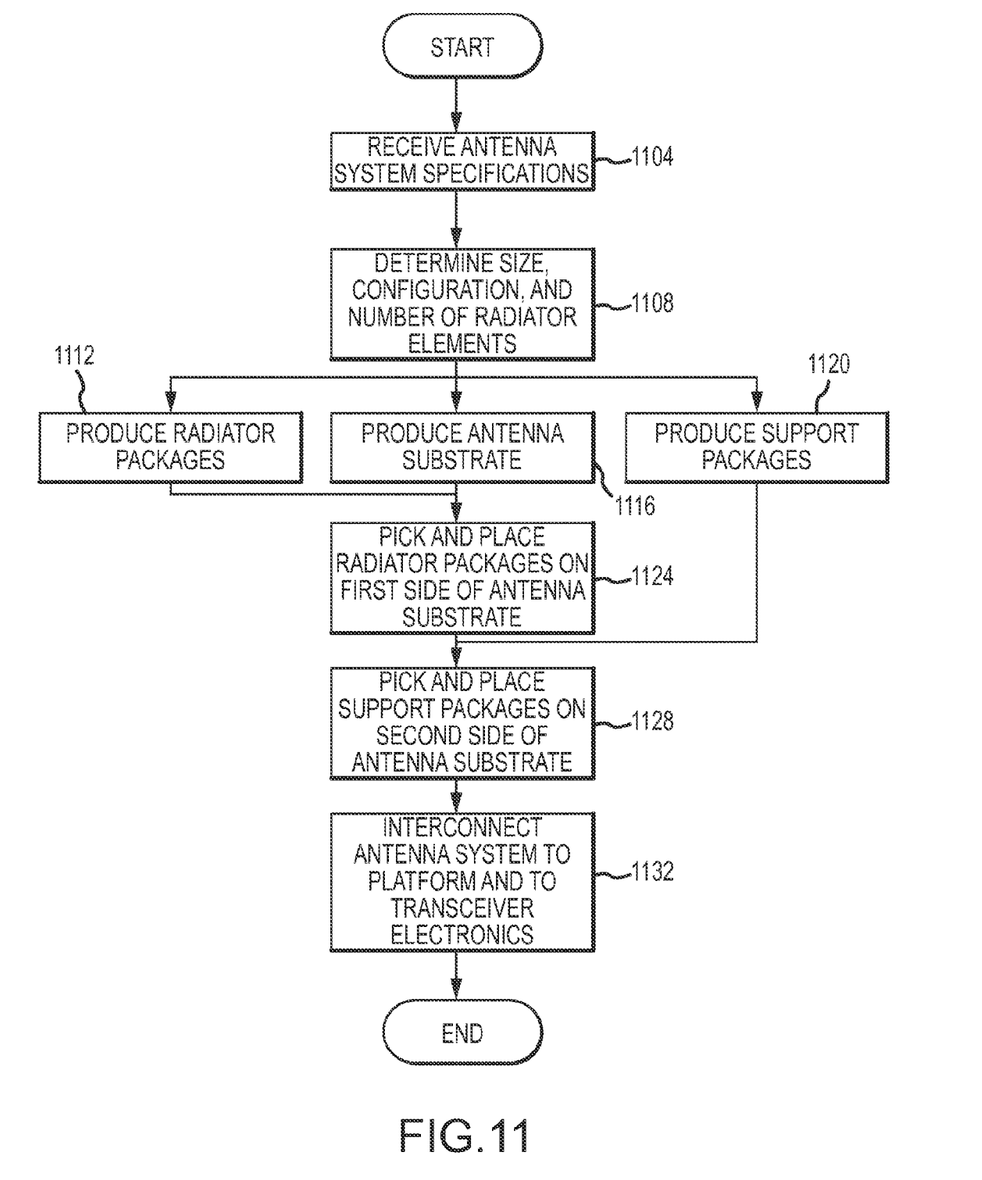
FIG. 11 is a flowchart depicting aspects of the creation of a phased array antenna system in accordance with embodiments of the present invention.

With reference to FIG. 11, aspects of the creation of a multiple beam phased array antenna 104 in accordance with embodiments of the present invention are depicted. Initially, at step 1104, the antenna system 104 specifications are received. These specifications can include the operating frequency or frequencies of the antenna system, the number of beams to be supported, the degree of steering of those beams, the number of signal polarizations, and the desired far field performance characteristics. From the specifications, the dimensions, configuration, and required number of radiator elements 308 are determined (step 1108).

At step 1112, the required number of radiator packages 208 incorporating the radiator elements 308 are produced. In accordance with embodiments of the present invention, the required number of radiator packages 208 is equal to the number of radiator elements 308. More particularly, the required number of radiator packages 1112 is equal to the number of radiator elements 308, where each radiator package 208 includes one radiator element 308. According to other embodiments, there are multiple radiator elements 308 per radiator package 208, in which case the required number of radiator packages 208 is some fraction of the required number of radiator elements 308. Producing the radiator packages 208 can include, for each radiator package 208, forming the radiator element 308 on the radiator package substrate 312 surface adjacent the top of the radiator package 208 (i.e., the substrate surface farthest from the first side 204 of the antenna substrate 212 when the radiator package 208 is connected to the antenna substrate 212). Forming the radiator element 308 can include printing or otherwise depositing a metalized layer on the radiator package substrate 312. Producing the radiator package 208 additionally includes incorporating a radiator package integrated circuit 412 such that the radiator package integrated circuit 412 is fixed to the radiator package substrate 312 and is operatively interconnected to the radiator element 308, creating a completed radiator package 208. In accordance with further embodiments of the present invention, each radiator package 208 can include a plurality of radiator elements 308 and/or a plurality of integrated circuits 412.

At step 1116, the antenna substrate 212 is produced. In general, the antenna substrate 212 provides a structure for mechanically and electrically interconnecting the radiator packages 208 to the support packages 220. Accordingly, the antenna substrate 212 can include a supporting structure and conductors. Where the antenna substrate 212 comprises a printed circuit board, forming the antenna substrate 212 includes applying conventional circuit board or printed circuit board techniques for the required signal distribution traces or conductors. In addition, the antenna substrate 212 generally includes conductors for providing control signals to various components, including amplifiers 1004 and phase shifters 1028, and for distributing power to components, such as amplifiers 1004, as necessary. Producing the antenna substrate 212 also includes providing connection points for operatively interconnecting other elements to the antenna substrate 212. For example, radiator package contact points or pads 1008 are formed on the first side 204 of the antenna substrate 212, and support package contact points or pads 1040 are formed on the second side 216 of the antenna substrate 212.

At step 1120, support packages 220 are produced. Producing support packages 220 can include assembling devices that include an integrated circuit 1030 that provides one or more phase shifters 1028 that generally operate to form the beams 108 supported by the antenna system 104. Additionally or alternatively, support packages can be produced that incorporate additional structures or devices, such as buffer amplifiers. The number of support packages 220 required for a particular antenna system 104 depends on the number of functions and/or components contained within each support package 220.

At step 1124, a pick and place operation is performed to operatively interconnect the radiator packages 208 to the first side 204 of the antenna substrate 212. Similarly, at step 1128, a pick and place or other assembly operation is performed to operatively interconnect the support packages 220 to the second side 216 of the antenna substrate 212. In general, after the radiator packages 208 and the support packages 220 have been interconnected to the antenna substrate 212, the antenna system 104 is complete. In accordance with at least some embodiments of the present invention, components required for operation of the antenna system 104, such as power supply or transceiver equipment or electronics 1056, must be interconnected to the antenna system 104 before the antenna system 104 is operational. Accordingly, at step 1132, the antenna system 104 can be interconnected to a platform 112 and to transceiver electronics 1056. The process of creating an antenna system 104 may then end. Although steps described in connection with creating an antenna system 104 have been set forth in a particular order, it should be appreciated that different orderings of the steps are possible.

Figure 12A:
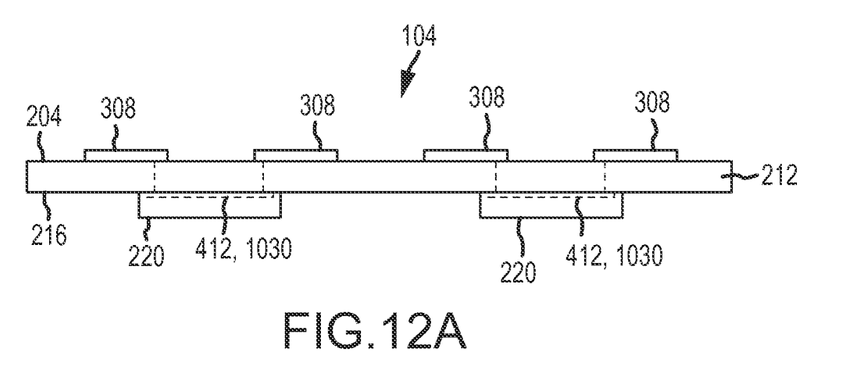
FIG. 12A depicts an antenna system in accordance with further embodiments of the present invention in elevation.
Figure 12B:
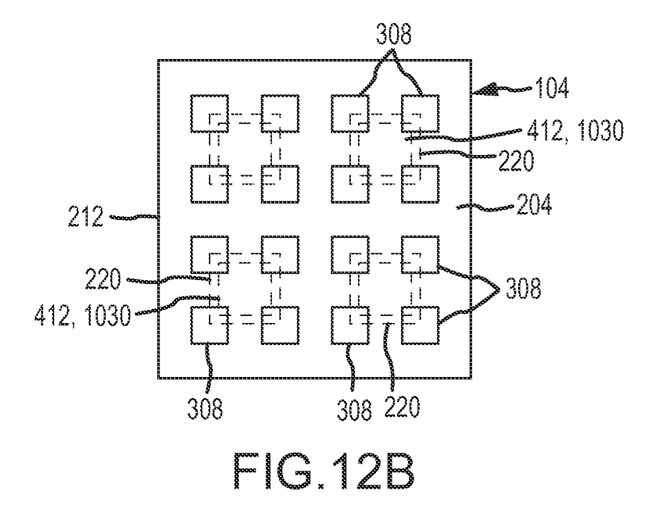
FIG. 12B depicts an antenna system in accordance with further embodiments of the present invention in plan view.

With reference now to FIGS. 12A and 12B, an antenna system 104 in accordance with still other embodiments of the present invention is illustrated. In this example, the radiator elements 308 are formed directly on the surface comprising a first side 204 of the antenna substrate 212. A support package 220 comprising one or more integrated circuits 412 and/or 1030 is interconnected to the second side 216 of the antenna substrate 212. As illustrated, a single support package 220 may support multiple radiator elements 308. For example, one support package 220 may be interconnected to four radiator elements 308. In accordance with still other embodiments, different support packages 220 performing different functions may be interconnected to one or more radiator elements 308 in common.

Figure 13:
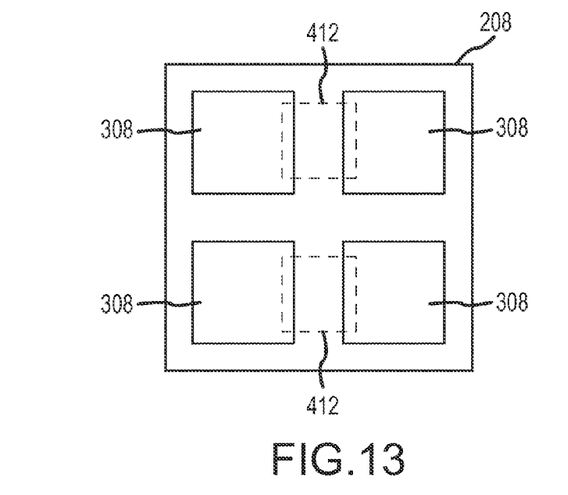
FIG. 13 depicts a first side of a radiator package in accordance with further embodiments of the present invention.

With reference now to FIG. 13, a radiator package 208 in accordance with further embodiments of the present invention is illustrated in plan view. In this embodiment, the radiator package 208 includes a plurality of radiator elements 308. As with other embodiments, the radiator package 208 may comprise multiple integrated circuits 412 that provide functions in support of the operation of the radiator package 208.

Figure 14A:
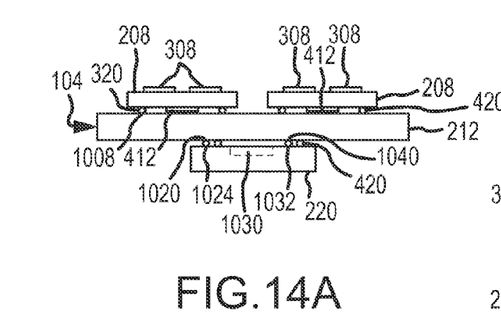
FIG. 14A depicts an antenna system in accordance with other embodiments of the present invention in elevation.
Figure 14B:
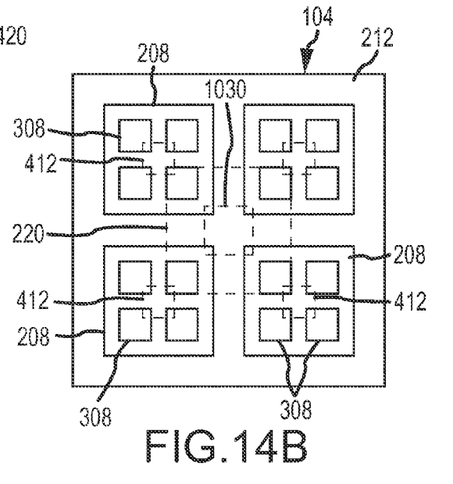
FIG. 14B depicts an antenna system in accordance with other embodiments of the present invention in plan view.

FIGS. 14A and 14B illustrate an antenna system 104 in accordance with further embodiments of the present invention. In the example illustrated in FIGS. 14A and 14B, each radiator package 208 includes a plurality of radiator elements 308. In addition, A single support package 220 supports multiple radiator packages 208. For instance, and without limitation, each support package 220 included in the antenna system 104 can support four radiator packages 208. Although a single support package 220 and a set of four radiator packages 208 are illustrated, an antenna system 104 in accordance with embodiments of the present invention can include multiple sets of radiator packages 208 and support packages 220 interconnected to first 204 and second 216 sides of an antenna substrate 212 respectively.

In accordance with embodiments of the present invention, as further examples, the radiator packages 208 may comprise monolithic microwave integrated circuits (MMICs) with operating frequencies in excess of 10 GHz, and can have integrated matching networks. The radiator package integrated circuits 412 may be formed from gallium arsenide (GaAs) and other type III/V semiconductors, with operating frequencies of up to 44 GHz. The radiator package integrated circuits may also comprise silicon germanium (SiGe) semiconductors and other type IV semiconductors. The radiator packages 208 typically have dimensions of 2 to 6 mm per side in plan view, and a height of 0.030 inches to 0.060 inches. The radiation package 208 layers 312 can be comprised of pre-preg, exclusively or in combination with non pre-preg layers, or cured material layers. The layers 312 may also include metalized layers that can be etched to provide conductive traces. The vias 416 may comprise plated holes. The support packages 220 can comprise GaAs phase shifters, SiGe phase shifter integrated circuits or other phase shifter integrated circuits that each support any number of channels. For example, the support packages can support 4 to 16 channels with phase and amplitude control. The support packages 220 can additionally include buffer/driver amplifiers in the same or in different packages as the support packages 220 providing the phase shifters 1028. Embodiments of the described invention can be used to provide phased array antennas operating at high frequencies, such as at the X, Ku, K, Ka and Q-bands. For example, an antenna system 104 for operation at 20 GHz can include radiator elements 308 having an area of 0.3 inches by 0.3 inches, and a single radiator packages integrated circuit 412. For antenna systems 104 operational at lower frequencies, the additional available area can allow for additional radiator package integrated circuits 412 as part of each radiator package 208. For example, an antenna system operating an X band might feature radiator elements 308 having an area of 0.6 inches by 0.6 inches, and a plurality of radiator package integrated circuits 412 in each radiator package 208. In addition, an antenna system 104 in accordance with embodiments of the present invention can scan by different amounts in different directions, or can be non-scanning. For example, full scan in one direction and a ½ scan in another direction can be provided. Moreover, a phase shifter can be associated with some, but not all of the radiator elements, for example where the antenna system 104 is designed to provide a ±5° scan.

The foregoing discussion of the invention has been presented for purposes of illustration and description. Further, the description is not intended to limit the invention to the form disclosed herein. Consequently, variations and modifications commensurate with the above teachings, within the skill or knowledge of the relevant art, are within the scope of the present invention. The embodiments described hereinabove are further intended to explain the best mode presently known of practicing the invention and to enable others skilled in the art to utilize the invention in such or in other embodiments and with various modifications required by the particular application or use of the invention. It is intended that the appended claims be construed to include alternative embodiments to the extent permitted by the prior art.

What is claimed is:

1. An antenna system, comprising:
 a plurality of radiator packages, wherein each radiator package in the plurality of radiator packages includes;
  a radiator element;
  a radiator package integrated circuit;
  a feed interconnecting the radiator element to the radiator package integrated circuit;
 an antenna substrate, wherein the antenna substrate includes a plurality of electrically conductive traces, wherein each radiator package included in the plurality of radiator packages is attached to a first side of the antenna substrate;
a first plurality of support packages, wherein each support package in the first plurality of support packages includes a support package integrated circuit, wherein each support package in the first plurality of support packages is attached to a second side of the antenna substrate and wherein each support package in the first plurality of support packages is electrically interconnected to at least one radiator package in the plurality of radiator packages by an electrically conductive trace included in the plurality of electrically conductive traces of the antenna substrate, wherein the antenna system comprises a planar array antenna system, wherein the support package integrated circuit included in each support package in the first plurality of support packages includes a phase shifter, and wherein the antenna substrate includes a plurality of splitters.

2. The antenna system of claim 1, wherein each radiator package includes a plurality of radiator elements.

3. The antenna system of claim 1, further comprising:
a shield, wherein the radiator element is located on a first side of the shield, and wherein the radiator package integrated circuit is located on a second side of the shield.

4. The antenna system of claim 3, wherein the radiator element located on a first side of the shield of each radiator package in the plurality of radiator packages is a driver element, and wherein each radiator package in the plurality of radiator packages further includes a passive radiator element.

5. The antenna system of claim 1, wherein the radiator package integrated circuit included in each of the radiator packages includes an amplifier.

6. The antenna system of claim 1, wherein the antenna substrate includes at least a portion of a beam forming network.

7. The antenna system of claim 6, wherein the antenna substrate includes a plurality of layers.

8. The antenna system of claim 1, wherein the antenna substrate is a planar, multi-layer circuit board.

9. The antenna system of claim 1, wherein each radiator package forms one element of a multiple element phase array antenna system.

10. The antenna system to claim 9, wherein each radiator package includes a plurality of feeds electrically interconnecting the radiator element to the radiator package integrated circuit.

11. The antenna system of claim 1, further comprising:
a second plurality of support packages, wherein each support package in the second plurality of support packages is attached to the second side of the antenna substrate.

12. An antenna system, comprising:
a plurality of radiator packages, wherein each radiator package in the plurality of radiator packages includes;
a radiator element;
a radiator package integrated circuit;
a feed interconnecting the radiator element to the radiator package integrated circuit;
an antenna substrate, wherein the antenna substrate includes a plurality of electrically conductive traces, wherein each radiator package included in the plurality of radiator packages is attached to a first side of the antenna substrate;
a plurality of support packages, wherein each support package in the plurality of support packages includes a support package integrated circuit, wherein each support package in the plurality of support packages is attached to a second side of the antenna substrate and wherein each support package in the plurality of support packages is electrically interconnected to at least one radiator package in the plurality of radiator packages by an electrically conductive trace included in the plurality of electrically conductive traces of the antenna substrate, wherein each radiator package included in the plurality of radiator packages includes a shield, wherein the radiator element is located on a first side of the shield, wherein a plurality of radiator package integrated circuits are located on a second side of the shield, and wherein for each radiator package the plurality of included radiator package integrated circuits are electrically interconnected to the radiator element either directly or through another radiator package integrated circuit.

13. The antenna system of claim 12, wherein the antenna system comprises a planar array antenna system.

14. The antenna system of claim 13, wherein the support package integrated circuit included in each of the support packages includes a phase shifter.

15. The antenna system of claim 14, wherein the antenna substrate includes a plurality of splitters.

16. The antenna system of claim 12, wherein the radiator package integrated circuit included in each of the radiator packages includes an amplifier.

17. An antenna apparatus, comprising:
a radiator package, including:
a radiator element;
a radiator package integrated circuit, wherein the radiator package integrated circuit includes an amplifier;
a feed interconnecting the radiator element to the integrated circuit;
an antenna substrate, wherein the radiator package is interconnected to a first side of the antenna substrate;
a support package, wherein the support package includes an integrated circuit comprising a phase shifter, wherein the support package is interconnected to a second side of the antenna substrate, wherein the support package is electrically interconnected to the radiator package, herein the antenna apparatus is operative to provide a phase shifted signal that is at least one of transmitted or received by the antenna apparatus, and wherein the radiator element includes a driven element and a passive element.

18. The antenna apparatus of claim 17, wherein the radiator package integrated circuit is a silicon-germanium integrated circuit.

19. A method for providing an array antenna, comprising:
providing a plurality of first integrated circuit packages, wherein each first integrated circuit package includes a radiator element and an integrated circuit that includes an amplifier, and wherein each first integrated circuit package includes a feed interconnecting the radiator element to the integrated circuit;
providing an antenna substrate, wherein the antenna substrate includes a plurality of splitters;
interconnecting each first integrated circuit package to a first side of the antenna substrate;
providing a plurality of second integrated circuit packages, wherein each second integrated circuit package includes a phase shifter;
interconnecting each second integrated circuit package to a second side of the antenna substrate, wherein each second integrated circuit package is electrically interconnected to at least one first integrated circuit package by interconnections provided by the antenna substrate, wherein the array antenna comprises a planar array antenna system.

20. The method of claim 19, wherein providing a plurality of first integrated circuit packages includes, for each first integrated circuit package:
  interposing a shield between the radiator and the integrated circuit including an amplifier.

21. The method of claim 20, further comprising:
  at least one of transmitting or receiving a signal through the radiator elements, wherein the signal has a frequency of at least 10 GHz.

22. The method of claim 21, further comprising:
  steering a beam associated with the signal, wherein steering the beam includes controlling a phase shift introduced to the signal by the phase shifters of the second integrated circuit packages.

* * * * *

UNITED STATES PATENT AND TRADEMARK OFFICE
CERTIFICATE OF CORRECTION

| | | |
|---|---|---|
| PATENT NO. | : 8,502,735 B1 | Page 1 of 1 |
| APPLICATION NO. | : 12/948401 | |
| DATED | : August 6, 2013 | |
| INVENTOR(S) | : Peter J. Moosbrugger et al. | |

It is certified that error appears in the above-identified patent and that said Letters Patent is hereby corrected as shown below:

In the Claims:

Claim 9, column 13, line 43, "phase" should read --phased--.

Claim 17, column 14, line 42, "herein" should read --wherein--.

Signed and Sealed this
Fifth Day of November, 2013

Teresa Stanek Rea
*Deputy Director of the United States Patent and Trademark Office*